US007351517B2

(12) United States Patent
Rondon

(10) Patent No.: US 7,351,517 B2

(45) Date of Patent: Apr. 1, 2008

(54) LITHOGRAPHIC PRINTING WITH PRINTING MEMBERS INCLUDING AN OLEOPHILIC METAL AND PLASMA POLYMER LAYERS

(75) Inventor: Sonia Rondon, Andover, MA (US)

(73) Assignee: Presstek, Inc., Hudson, NH (US)

( * ) Notice: Subject to any disclaimer, the term of this patent is extended or adjusted under 35 U.S.C. 154(b) by 0 days.

(21) Appl. No.: 11/401,568

(22) Filed: Apr. 11, 2006

(65) Prior Publication Data

US 2006/0234162 A1 Oct. 19, 2006

Related U.S. Application Data

(60) Provisional application No. 60/672,161, filed on Apr. 15, 2005.

(51) Int. Cl.

| | |
|---|---|
| ***G03F 7/11*** | (2006.01) |
| ***G03F 7/095*** | (2006.01) |
| ***G03F 7/039*** | (2006.01) |
| ***G03F 7/36*** | (2006.01) |

(52) U.S. Cl. ............................... 430/276.1; 430/271.1; 430/277.1; 430/302; 430/964; 430/273.1

(58) Field of Classification Search ............. 430/270.1, 430/271.1, 302, 434, 494, 944, 945, 276.1, 430/277.1, 964, 273.1

See application file for complete search history.

(56) References Cited

U.S. PATENT DOCUMENTS

| | | | |
|---|---|---|---|
| 4,577,932 | A | 3/1986 | Gelbart |
| 4,743,327 | A | 5/1988 | DeHaan et al. |
| 5,102,708 | A | 4/1992 | Matsubara et al. |
| 5,121,706 | A | 6/1992 | Nichols et al. |
| 5,310,869 | A | 5/1994 | Lewis et al. |
| 5,339,737 | A | 8/1994 | Lewis et al. |
| 5,385,092 | A | 1/1995 | Lewis et al. |
| 5,447,799 | A | 9/1995 | Loh et al. |
| 5,517,359 | A | 5/1996 | Gelbart |
| RE35,512 | E | 5/1997 | Nowak et al. |
| 5,802,034 | A | 9/1998 | Gelbart |
| 5,836,249 | A | 11/1998 | Chatterjee et al. |
| 5,861,992 | A | 1/1999 | Gelbart |
| 5,972,435 | A | 10/1999 | Takai et al. |
| 6,105,501 | A | 8/2000 | Phillips et al. |
| 6,238,843 | B1 | 5/2001 | Ray et al. |
| 6,344,303 | B1 | 2/2002 | Takahashi |
| 2002/0146636 | A1 | 10/2002 | Ellis |

(Continued)

FOREIGN PATENT DOCUMENTS

| | | |
|---|---|---|
| EP | 0 941 841 A2 | 9/1999 |

(Continued)

OTHER PUBLICATIONS

International Search Report for International Application No. PCT/US05/015343 dated Sep. 14, 2005 (3 pages).

(Continued)

*Primary Examiner*—Richard L. Schilling
(74) *Attorney, Agent, or Firm*—Goodwin Procter LLP

(57) ABSTRACT

Printing members that include a plasma polymer layer exhibit enhanced tolerance for high imaging-power densities. The plasma polymer layer may contain or be adjacent to an oleophilic metal such as copper.

23 Claims, 7 Drawing Sheets

U.S. PATENT DOCUMENTS

| | | | |
|---|---|---|---|
| 2005/0250048 A1 | 11/2005 | Rondon et al. | |

FOREIGN PATENT DOCUMENTS

| | | |
|---|---|---|
| WO | 00/15435 | 3/2000 |
| WO | 2005/108076 A1 | 11/2005 |

OTHER PUBLICATIONS

Written Opinion for International Application No. PCT/US05/015343 dated Sep. 14, 2005 (5 pages).

International Search Report Written Opinion for International Application No. PCT/US05/013543 dated Nov. 28, 2006.

LITHOGRAPHIC PRINTING WITH PRINTING MEMBERS INCLUDING AN OLEOPHILIC METAL AND PLASMA POLYMER LAYERS

CROSS-REFERENCE TO RELATED APPLICATION

This application claims priority to and the benefits of U.S. Ser. No. 60/672,161, filed on Apr. 15, 2005, the entire disclosure of which is hereby incorporated by reference.

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. In a wet lithographic system, the non-image areas are hydrophilic, and the necessary ink-repellency is provided by an initial application of a dampening fluid to the plate prior to inking. The dampening fluid prevents ink from adhering to the non-image areas, but does not affect the oleophilic character of the image areas. Ink applied uniformly to the wetted printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

To circumvent the cumbersome photographic development, plate-mounting, and plate-registration operations that typify traditional printing technologies, practitioners have developed electronic alternatives that store the imagewise pattern in digital form and impress the pattern directly onto the plate. Plate-imaging devices amenable to computer control include various forms of lasers.

Current laser-based lithographic systems generally rely on removal of an energy-absorbing layer from the lithographic plate to create an image. Exposure to laser radiation may, for example, cause ablation—i.e., catastrophic overheating—of the ablated layer in order to facilitate its removal. Accordingly, the laser pulse must transfer substantial energy to the absorbing layer. This means that even low-power lasers must be capable of very rapid response times, and imaging speeds (i.e., the laser pulse rate) must not be so fast as to preclude the requisite energy delivery by each imaging pulse. In addition, existing printing members often require a post-imaging processing step to remove debris generated during the imaging process.

As explained in U.S. Ser. No. 10/839,646, filed on May 5, 2004 and hereby incorporated by reference, a plasma polymer layer can be employed to facilitate selective removal of the imaging layer of a lithographic plate, which allows for imaging with low-power lasers. In addition, the printing member can be used on-press immediately after being imaged without the need for a post-imaging processing step. Although such plates are satisfactory for many applications, under some circumstances the oleophilic behavior of the exposed image areas can exhibit sensitivity to the power density delivered by the imaging sources. For example, power levels over 440 mJ/cm$^2$ may cause thermal damage to the exposed image areas, compromising printing performance by reducing or even eliminating the oleophilic character of the substrate. It is found, for example, that plates incorporating plasma-polymer layers work very well with laser sources that provide a uniform (e.g., square and gaussian) energy profile, particularly at power density levels below 400 mJ/cm$^2$, but may suffer performance degradation when imaged by laser sources that deliver a non-uniform (e.g., multimode) energy profiles. The reason is that, even at average power densities below 400 mJ/cm$^2$, a multimode laser beam includes "hot spots" with energies well above the average, and which can thermally damage the plate. While it is possible to restore much of the lost printing performance through additional processing (e.g., cleaning with organic solvents, hydrophobic self-recovery by exposure to atmosphere for at least six hours, etc.), the extra steps involved and the environmental concerns posed by many solvents render such processing undesirable.

SUMMARY OF THE INVENTION

The present invention involves printing members that include a plasma polymer layer but which exhibit enhanced tolerance for high imaging-power densities. Printing members in accordance with the invention can be used on-press immediately after being imaged without the need for a post-imaging processing step. In a first aspect, the invention involves a lithographic printing member that includes an imaging layer that absorbs imaging radiation, a plasma polymer layer that includes a plasma-polymerized hydrocarbon, a metal, and a substrate therebeneath. The imaging layer and at least one of the plasma polymer layer, the metal and the substrate have opposite affinities for ink and a liquid to which ink will not adhere. In particular, the invention recognizes that the ink-receptivity and the imaging efficiency of lithographic printing plates based on inorganic and organic films may be improved by the addition of a metal, and preferably an oleophilic metal, in combination with or in addition to thin films produced by a plasma polymerization process.

The imaging layer may be hydrophilic. It may include a ceramic, such as one or more metal carbides (e.g., TiC, ZrC, HfC, VC, NbC, TaC, BC, and SiC), metal nitrides (e.g., TiN, ZrN, HfN, VN, NbN, TaN, BN, $Si_3N_4$, $Cr_3C$, $Mo_2C$, and WC), metal oxides (e.g., TiO, $Ti_2O_3$, TiO2, BeO, MgO, and $ZrO_2$), carbonitrides, oxynitrides, oxycarbides, or combinations thereof.

The metal component may include or consist of a non-carbidic noble metal such as Cu, Ag, Au, Pt, Pd, or combinations or alloys thereof. The metal may be deposited as a discrete film having a thickness of about 10 nm to about 40 nm. In such embodiments, the oleophilic plasma polymer component is also applied as one or more discrete films. The plasma polymer layer(s) may have an aggregate thickness of about 5 nm to about 20 nm. Alternatively, the metal may be integrated into a nanocomposite film in which metal clusters are embedded within a polymer matrix. This single composite layer may have a thickness ranging from about 5 nm to about 30 nm. The hydrocarbon gas used to form the plasma polymer component may include or consist of methane, ethane, propane, ethylene, or acetylene. The substrate may be hydrophilic or oleophilic. Suitable materials for the substrate include polymers (e.g., polyesters, such as polyethylene terephthalate and polyethylene naphthalate, polycarbonates, polyurethane, acrylic polymers, polyamide polymers, phenolic polymers, polysulfones, polystyrene, and cellulose acetate) and metals (e.g., aluminum, chromium, steel, and alloys thereof). At least one surface of a metal substrate may be anodized. A transition layer may be disposed over the substrate. The transition layer may include a polymer, such as an acrylate polymer.

Copper is a preferred oleophilic metal. In some embodiments, the metal is applied as a discrete layer over the plasma polymer layer(s), below this (or these) layer(s), or can be sandwiched between plasma polymer layers. In other embodiments, the metal and the plasma polymer are co-deposited in a single process. In such embodiments, the metal may take the form of particles coated along with the polymeric material so as to become integrated therein. In all of these embodiments, a ceramic imaging layer may be disposed over the metal-polymer layers, and a hydrophilic protective layer may be disposed over the imaging layer. Polyvinyl alcohol is a suitable material for a protective layer.

In embodiments in which copper is applied as a separate layer above or below one or more polymer-like carbon films, the resulting constructions exhibit good ink-receptivity and imaging sensitivity. However, the durability of such plates may suffer when used in acidic press environments ($pH<5.5$), e.g., with fountain solutions containing a high concentration of oxidizing acids. Slow degradation of a copper layer may, for example, cause chemical wear of the areas of this printing member not exposed to imaging radiation.

Embodiments utilizing embedded metal clusters, particularly those involving a single composite of copper clusters coated and embedded in a polymer matrix and produced in a single-step vacuum-deposition process, are therefore preferred. A metal-polymer composite film may be produced by simultaneous plasma polymerization of a polymer-forming gas and sputtering of a metal target in a magnetron sputtering plasma source. In this embodiment, the metal-containing layer is not significantly degraded due to the action of the acidic solutions typically used in printing.

In another aspect, the invention involves a method of imaging the lithographic printing member described above. The printing member is exposed to imaging radiation in an imagewise pattern, which causes ablation of the imaging ceramic layer exposed to the radiation to ablate. At least the portions of the imaging layer that received radiation are removed to create an imagewise lithographic pattern on the printing member. In particular, the ceramic layer absorbs the imaging radiation and generates heat that diffuses rapidly to the interfacial areas. The heat triggers physical and chemical processes that result in removal of the ceramic layer. In the process, a large portion of the plasma polymer-like component is lost due to vaporization. The exposed printing member will generally have a highly modified surface, but the oleophilic metal components provide strong interaction with ink. The plate construction displays good compatibility with the high power and non-uniform imaging sources used in some commercial imaging systems. In some embodiments the ceramic layer and at least part of the polymer components are removed in the imaging process, leaving a metal-rich printing image.

It should be stressed that, as used herein, the term "plate" or "member" refers to any type of printing member or surface capable of recording an image defined by regions exhibiting differential affinities for ink and/or fountain solution. Suitable configurations include the traditional planar or curved lithographic plates that are mounted on the plate cylinder of a printing press, but can also include seamless cylinders (e.g., the roll surface of a plate cylinder), an endless belt, or other arrangement.

Furthermore, the term "hydrophilic" is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus, a hydrophilic surface in accordance herewith exhibits preferential affinity for any of these materials relative to oil-based materials.

DESCRIPTION OF THE PREFERRED EMBODIMENTS

1. Imaging Apparatus

Figure 1:
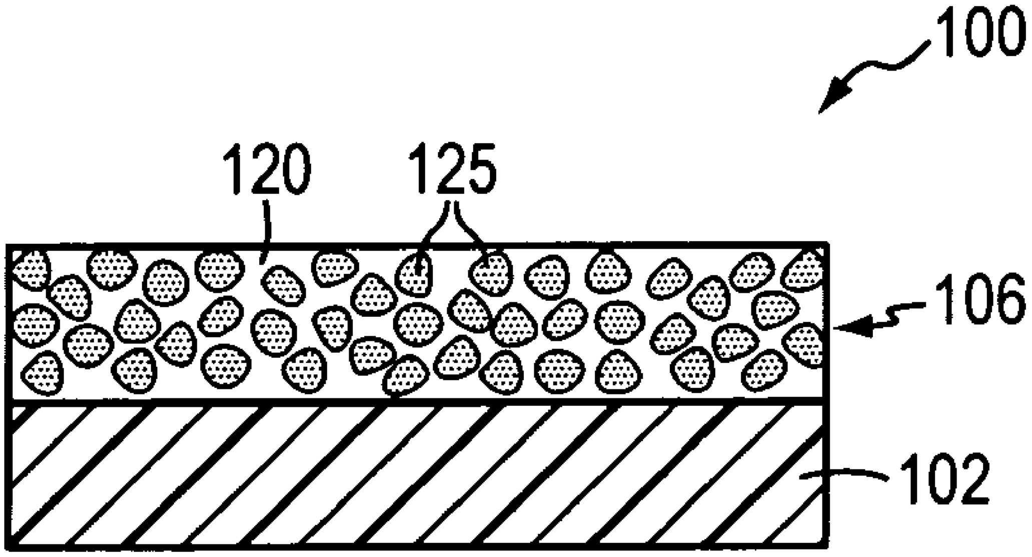
FIG. 1 is an enlarged cross-sectional view of the ink-receptive portion of a negative-working printing member or a positive-working printing member in its own right according to the invention. The illustrated constructions includes a substrate and a thin metal-doped film produced by, for example, simultaneous sputtering and plasma polymerization such that the film has metal particles embedded in, and coated with, a plasma polymer matrix.

An imaging apparatus suitable for use in conjunction with the present printing members includes at least one laser device that emits in the region of maximum plate responsiveness, i.e., whose $\lambda_{max}$ closely approximates the wavelength region where the plate absorbs most strongly. Specifications for lasers that emit in the near-IR region are fully described in U.S. Pat. Nos. Re. 35,512 ("the '512 patent") and 5,385,092 ("the '092 patent"), the entire disclosures of which are hereby incorporated by reference. Lasers emitting in other regions of the electromagnetic spectrum are well-known to those skilled in the art.

Suitable imaging configurations are also set forth in detail in the '512 and '092 patents. Briefly, laser output can be provided directly to the plate surface via lenses or other beam-guiding components, or transmitted to the surface of a blank printing plate from a remotely sited laser using a fiber-optic cable. A controller and associated positioning hardware maintain the beam output at a precise orientation with respect to the plate surface, scan the output over the surface, and activate the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor ("RIP") or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

Other imaging systems, such as those involving light valving and similar arrangements, can also be employed; see, e.g., U.S. Pat. Nos. 4,577,932; 5,517,359; 5,802,034; and 5,861,992, the entire disclosures of which are hereby incorporated by reference. Moreover, it should also be noted that image spots may be applied in an adjacent or in an overlapping fashion.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam.

Regardless of the manner in which the beam is scanned, in an array-type system for on-press applications it is generally preferable to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid scanning (e.g., through use of high-speed motors, mirrors, etc.) and thereby utilize high laser pulse rates, can frequently utilize a single laser as an imaging source.

2. Lithographic Printing Members

The metal, ceramic, and plasma polymer films used in the present invention may be applied using a planar magnetron source plasma with carbon, metal, or ceramic targets as the electrode. The process can be performed using direct (DC) current or alternating current sources (i.e., AC and RF). Suitable configurations for planar magnetron sputtering are well-known in the art of vacuum coating; see, e.g., Vossen & Kern, "Thin Film Processes," Academic Press (1978). The sputtering deposition process may be carried out in sequence in the same vacuum system after deposition of the plasma polymer layer. Therefore, the base pressure of the system is desirably kept in the range of $10^{-5}$ to $10^{-6}$ Torr. This low pressure reduces the amount of water and other contaminants that could affect the properties of the ceramic imaging layer. For example, reduction or elimination of oxygen in the deposition system can be important because oxygen may react with the metal species during the magnetron deposition process, resulting in highly oxidized films with degraded optical, thermal, and mechanical properties. The magnetron-sputtering deposition process is typically carried out using flows of methane and argon mixtures that bring the total system pressures to values on the order of 1-3 mTorr.

All films used in the present invention are preferably continuous. The term "continuous" as used herein means that the surface of the substrate is completely covered with a uniform layer of the deposited material. The thickness of the polymer-like films used in this invention range from a few monolayers of material up to 20 nm. The metal-doped composite films may be varied between 5 nm and 20 nm, and films with copper-to-carbon atomic ratios ranging from 0.1 up to 15 may be employed. The polymerized organic films are generally transparent to the near-IR region typical of the laser output used on the imaging devices.

Figure 2:
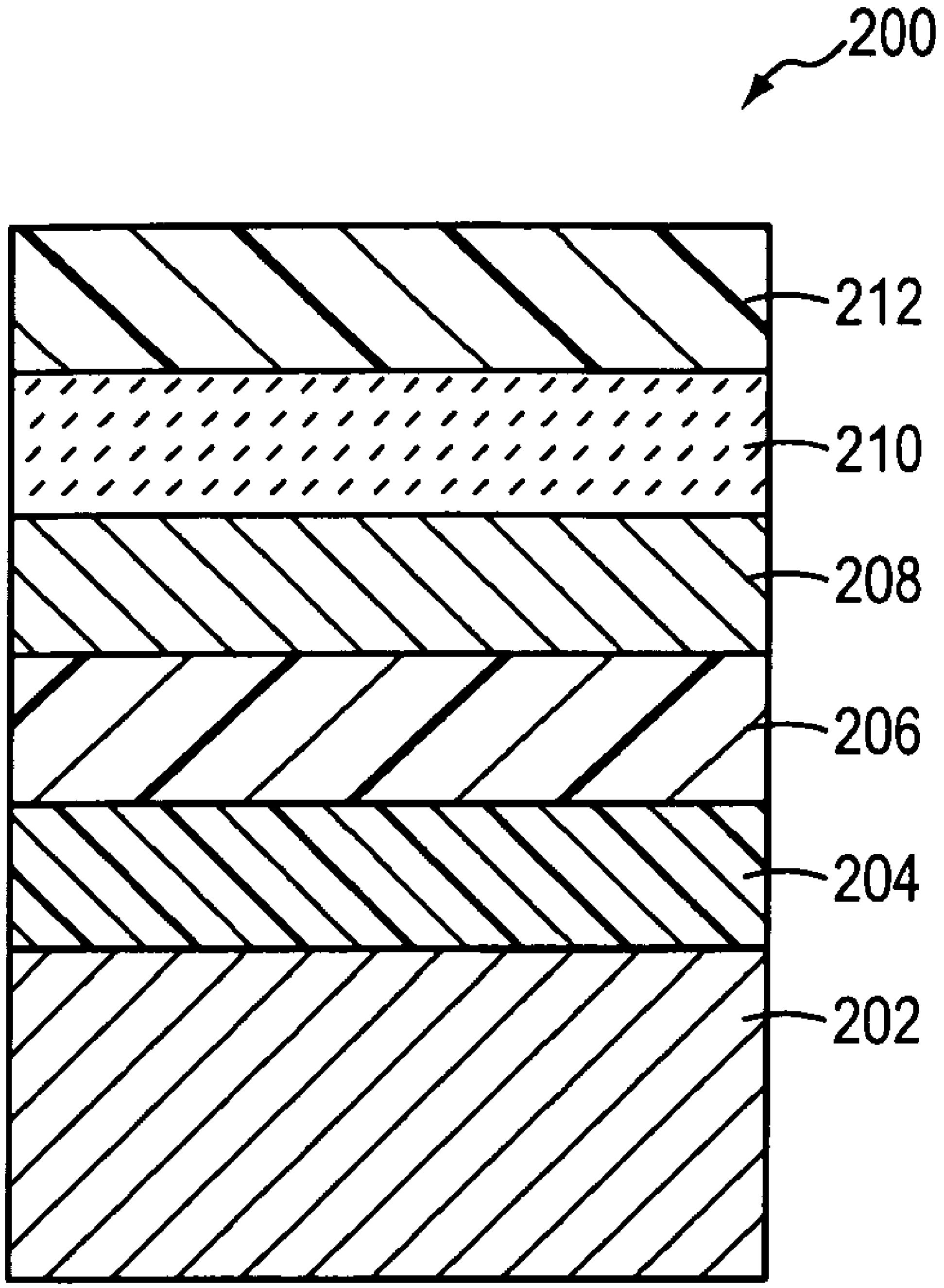
FIG. 2 is an enlarged cross-sectional view of a negative-working printing member according to the invention that includes a metal coated in a thin layer on top of a polymer-like carbon film and below a ceramic near-IR absorber layer.
Figure 4:
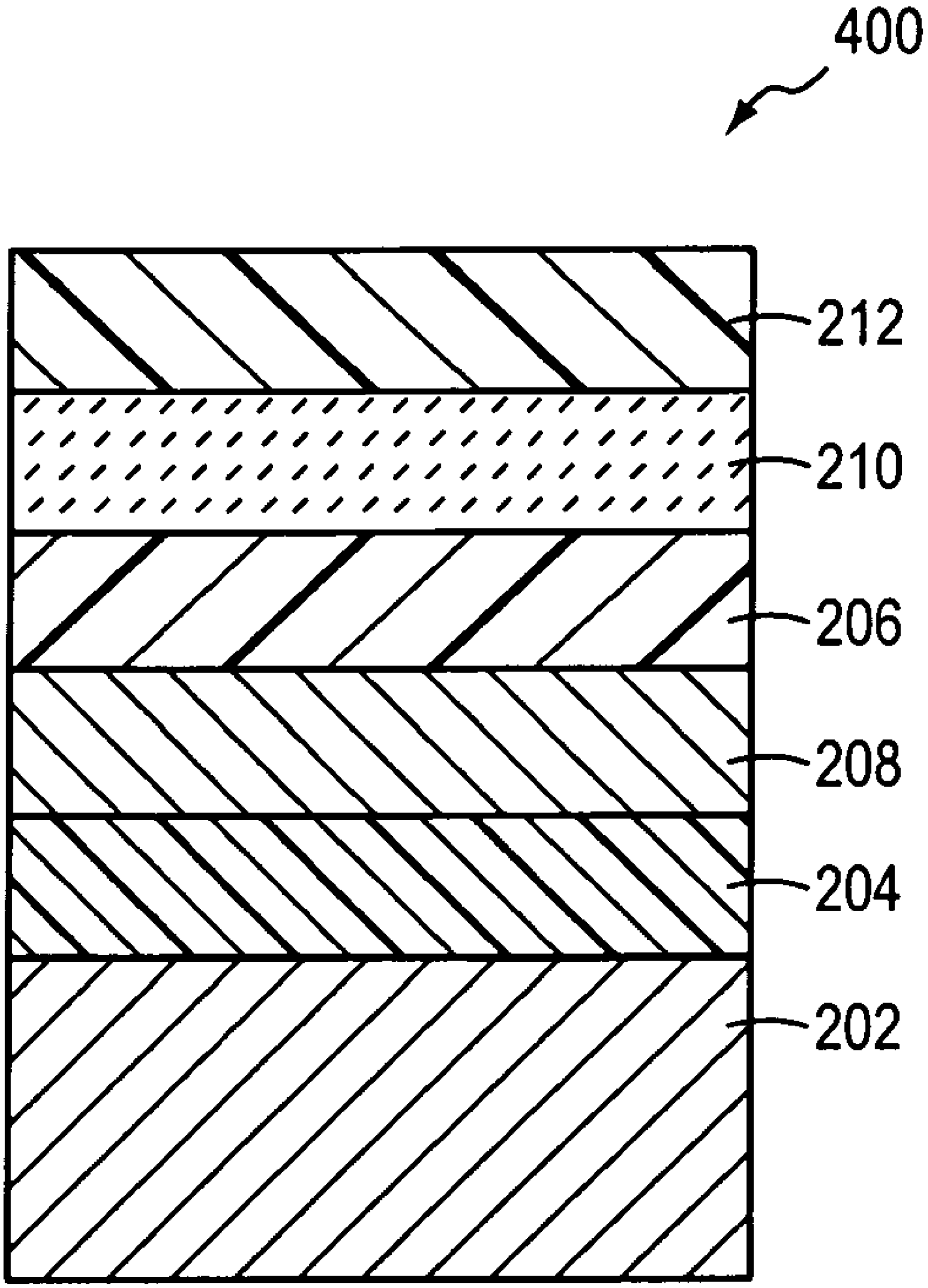
FIG. 4 is an enlarged cross-sectional view of a negative-working printing member with a thin metal film in direct contact with the substrate and subsequently covered with polymer-like carbon and near-IR absorber.
Figure 5:
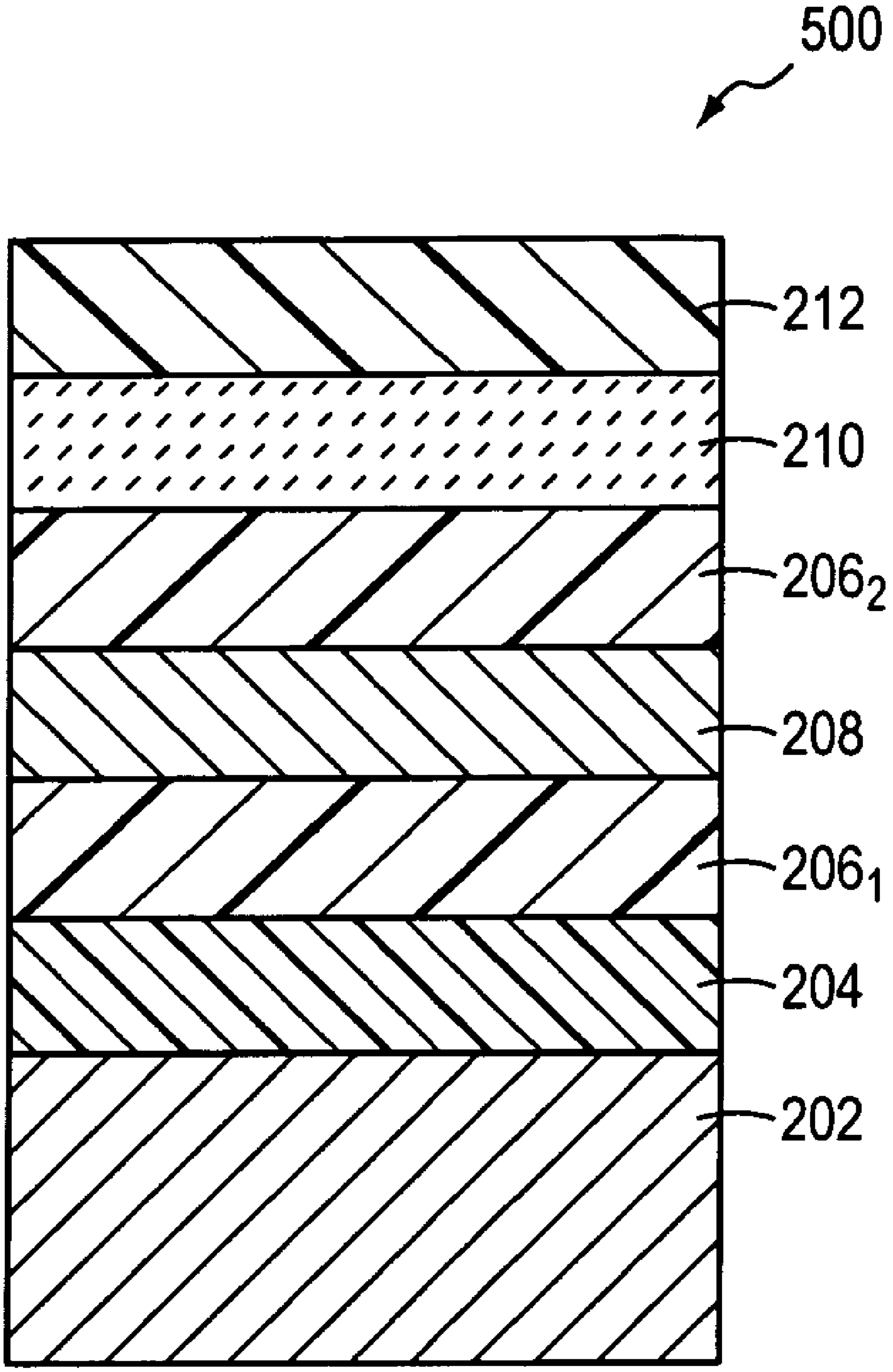
FIG. 5 is an enlarged cross-sectional view of a negative-working printing member in which the metal film is sandwiched between two layers of polymer-like carbon film.
Figure 6:
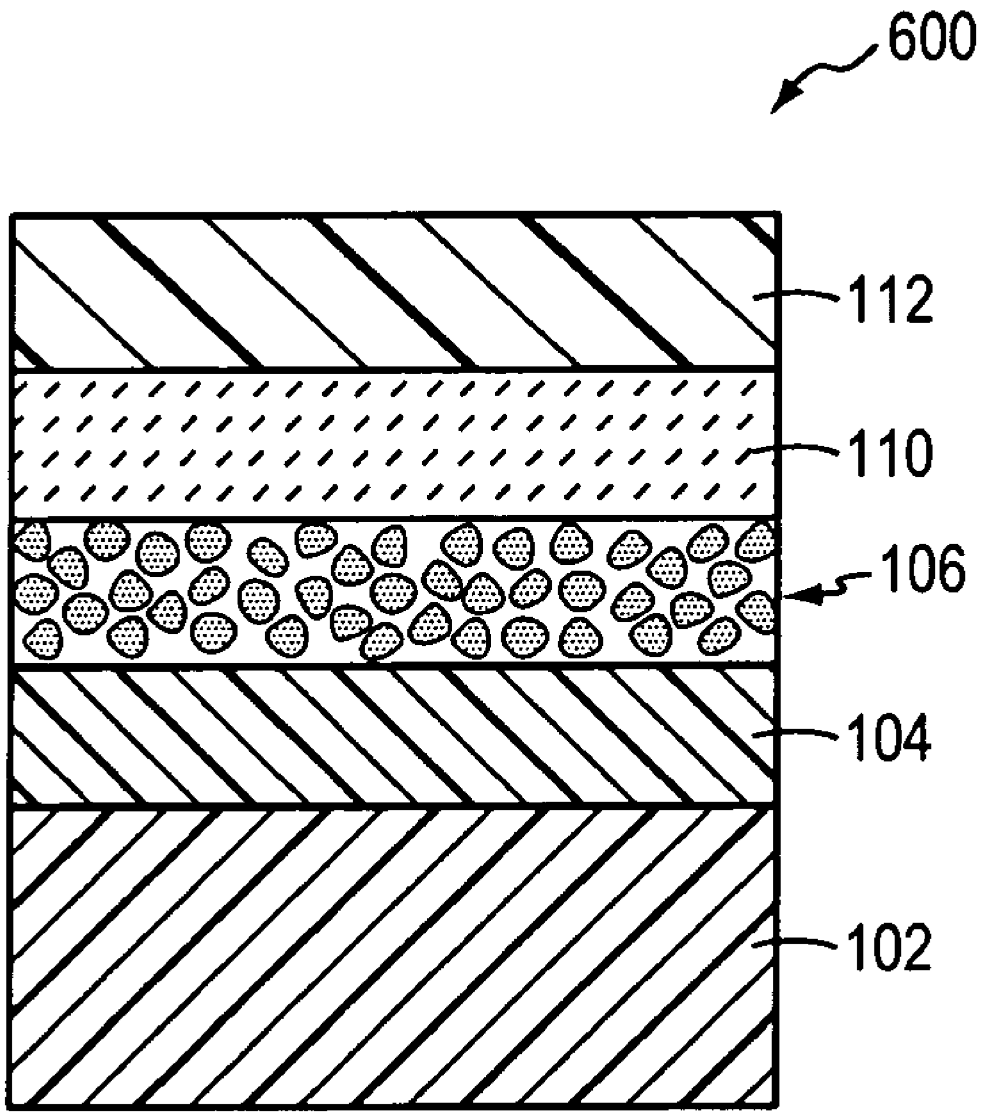
FIG. 6 is an enlarged cross-sectional view of a negative-working printing member utilizing a metal-doped polymer-like carbon film.

FIG. 1 illustrates an embodiment of a positive-working printing member 100 according to the invention that includes a hydrophilic substrate 102 and an oleophilic layer 106 that includes a plasma polymer phase 120 and a dispersion of oleophilic metal particles 125. Although this printing member can be imaged as described below, it exhibits limited durability and is therefore suitable for small-run applications. Alternatively, the illustrated construction may serve as a precursor to the printing member shown in FIG. 6. In preferred embodiments, layer 106 is infrared (IR) sensitive, and imaging of the printing member 100 (by exposure to IR radiation) results in imagewise removal of the oleophilic layer 106 to reveal the underlying hydrophilic layer 102. FIG. 2 illustrates a positive-working printing member 200 according to the invention that includes a substrate 202, a hardcoat transition layer 204, a plasma polymer 206, a thin metal layer 208, an IR-sensitive imaging layer 206, and an optional protective layer 212. FIG. 4 illustrates a variation of the embodiment illustrated in FIG. 2, in which the adjacent positions of layers 206, 208 have been reversed. FIG. 5 illustrates a further variation that includes two plasma polymer layers $\mathbf{206}_1$, $\mathbf{206}_2$ that sandwich thin metal layer 208. FIG. 6 illustrates a negative-working printing member 600 according to the invention that utilizes the substrate 102 and oleophilic layer 106 shown in FIG. 1 in conjunction with a transition layer 104, an imaging layer 110, and an optional protective topcoat 112. Each of these layers and their functions will be described in detail below.

a. Substrate 102, 202

The substrate provides dimensionally stable mechanical support to the printing member. The substrate should be strong, stable, and flexible. One or more surfaces of the substrate can be either hydrophilic or oleophilic. Suitable substrate materials include, but are not limited to, metals, polymers, and paper.

Metals suitable for use in substrates according to the invention include, but are not limited to, aluminum, chromium, steel, and alloys thereof, which may have another metal (e.g., copper) plated over one surface. Metal substrates can have thicknesses ranging from about 50 μm to about 500 μm or more, with thicknesses in the range of about 100 μm to about 300 μm being preferred.

One or more surfaces of a metal substrate may be anodized. Anodizing increases the hardness and abrasion resistance of the metal surface, which improves the mechanical strength of the substrate. The anodic layer can also control dissipation of heat into the substrate, thus increasing the imaging efficiency of the printing member. An anodized aluminum substrate consists of an unmodified base layer and a porous, anodic aluminum oxide coating thereover. The anodized aluminum surface is hydrophilic; however, without further treatment, the oxide coating would lose wettability due to further chemical reaction. Anodized substrates are, therefore, typically exposed to a silicate solution or other suitable reagent (e.g., a phosphate reagent) that stabilizes the hydrophilic character of the plate surface. In the case of silicate treatment, the surface may assume the properties of a molecular sieve with a high affinity for molecules of a definite size and shape—including, most importantly, water molecules.

A preferred metal substrate is an anodized aluminum plate with a low degree of graining and an anodic layer having a thickness between about 0.5 μm and about 3 μm (available, for example, from Precision Lithograining Corp., South Hadley, Mass.).

Polymers suitable for use in substrates according to the invention include, but are not limited to, polyesters (e.g., polyethylene terephthalate and polyethylene naphthalate), polycarbonates, polyurethane, acrylic polymers, polyamide polymers, phenolic polymers, polysulfones, polystyrene, and cellulose acetate. A preferred polymeric substrate is polyethylene terephthalate film, such as the polyester films available from E. I. duPont de Nemours Co. (Wilmington, Del.) under the trademarks of MYLAR and MELINEX, for example.

Polymeric substrates can be coated with a hard polymer transition layer to improve the mechanical strength and durability of the substrate and/or to alter the hydrophilicity or oleophilicity of the surface of the substrate. A hydrophilic transition layer may include porous materials with oxygen functional groups at the surface. The addition of hydrophilic fillers such as, for example, silica particles, also enhances the mechanical properties of the transition layer. Examples of suitable materials for hard transition layers according to the invention include proprietary hard coat materials supplied under the tradename PR-2 by Bekaert Specialty Films, LLC (San Diego, Calif.). Other suitable formulations and application techniques for transition layers are described below and disclosed, for example, in U.S. Pat. No. 5,339,737, the entire disclosure of which is hereby incorporated by reference.

Polymeric substrates can have thicknesses ranging from about 50 μm to about 500 μm or more, depending on the specific printing member application. For printing members in the form of rolls, thicknesses of about 200 μm are preferred. For printing members that include transition layers, polymer substrates having thicknesses of about 50 μm to about 100 μm are preferred.

A wide variety of papers may be utilized as a substrate. Typically, papers are saturated with a polymeric treatment to improve dimensional stability, water resistance, and strength during the wet lithographic printing.

b. Transition Layer (hard coat) 104, 204

The transition layer serves to relieve stress between a relatively soft polymer substrate and the harder layers above; it is typically used when the polymer lacks suitable mechanical properties to act as a durable substrate. The transition layer generally is a hard organic polymer coating selected on the basis of specific mechanical properties, such as hardness and Young's modulus. The transition layer also should exhibit good adherence to the substrate and overlying layers. Preferred materials include hard polymer coatings based on thermal, UV, or e-beam cured acrylate monomers and oligomers. Filler materials, such as silica and/or titanium oxide, may be included in the transition layer to improve the mechanical properties of the coatings. Examples of commercially available materials suitable for use in transition layers include MARNOT and TERRAPIN coatings sold by Tecra Corporation (New Berlin, Wis.), and hard coats supplied by Bekaert Specialty Films, LLC, (San Diego, Calif.).

The transition layer can be applied to the substrate using any suitable coating technique known in the art. For example, the transition layer polymer can be dissolved or suspended in a solvent, applied to the substrate using a wire-wound rod, and dried and cured to form a uniform transition layer. The transition layer is generally applied to a thickness of about 1 μm to about 4 μm.

c. Oleophilic Metal Layer 208

Some embodiments of the present invention utilize discrete layers of an oleophilic metal and a plasma polymer (see FIGS. 2-5). The metal or metals used for this layer are desirably non-carbidic metals that exhibit a strong affinity for printing inks. Copper is preferred, but noble metals from Group 1B (e.g., Ag, Au or Pd), combinations thereof, and copper alloys are also suitable. Hydrophilic metals such as titanium, aluminum, silicon, zinc, chromium, vanadium, or zirconium may be used in combination with an oleophilic metal such as copper. The metal layer may be thin (e.g., about 5 nm to 50 nm) to minimize effects on the mechanical properties of the printing member.

The oleophilic character of copper is well documented in the art of lithographic printing. Copper films may be applied using either electroplating or chemical treatments with copper solutions. High-purity metal targets are desirably used for the deposition of the metal films. Thin metal films can be deposited using magnetron sputtering of metal targets in an argon atmosphere, for example, although any suitable vacuum process, such as laser ablation, can be used instead.

d. Metal-Doped Oleophilic Layer 106

A preferred embodiment of the invention utilizes a thin, nanocomposite copper-doped film, which may be produced by a combination of metal sputtering and atomic plasma polymerization processes. This layer can be applied in a single-step process whereby sputtering of a copper target and formation of a polymer-like in a magnetron sputtering source, using a mixture of argon and polymer-forming hydrocarbon gases, occur simultaneously. Suitable techniques for incorporating metals in amorphous carbon films are known in the art; see, e.g., Klages and Memmings, "Materials Science Forum," vols. 52-53 (1989). The plasma polymer is produced using planar DC, pulsed, or RF sources. Other plasma sources known in the art, such as glow-discharge and microwave plasmas, can also be utilized to advantage. Indeed, other processes entirely, such as co-sputtering of carbon and metal targets, or coevaporation of polymer and metal targets, are also possible.

The properties of the copper-doped plasma polymer layer (e.g., thickness, uniformity, etc.) depend on parameters such as the power used to activate the plasma, deposition time, partial pressure, and gas mass-flow ratio. The hydrocarbon gas for the plasma polymerization process may be one or more of methane, ethane, propane, ethylene, and acetylene. Selection of optimum deposition conditions is well within the skill of practitioners in the art. The thickness of this layer can range from about 5 nm to about 30 nm. A typical thickness is about 15 nm or less. The copper-to-carbon atomic ratio (Cu/C), measured by X-ray photoelectron spectroscopy (XPS) surface and depth profile analysis, of the composite can range from 0.1 up to 15.0. In preferred embodiments, the Cu/C ratio ranges from 1.1 to 3.8.

In general, the nanocomposite film has physical and chemical properties intermediate between those of the copper and polymer components. XPS studies of the near-surface chemical composition of nanocomposite layers according to the invention confirm that the copper particles are covered with a thin film of polymeric material. This reduces the interaction with polar molecules such as water. XPS analysis also suggests that the bulk copper species are mainly present in a metallic oxidation state. In addition, the near-surface metallic particles are coated with a protective or passivation thin layer of cuprous oxide and hydroxide.

Additional work on surface topography using scanning electron microscopy (SEM) suggests that the copper-doped films having high copper concentrations consist primarily of nanoparticles of copper with smaller particle size than that of pure copper films. The plasma polymer, by contrast, takes the form of a dense thin film. It appears that at high copper concentrations, the copper nanoparticles are coated with the polymeric component of the film. In films with lower copper concentrations, the particles are embedded in the polymeric matrix.

e. Imaging Layer 110, 210

The imaging layer absorbs imaging radiation and is at least partially ablated, thus capturing the image on the printing member. The imaging layer can be hydrophilic or oleophilic, but in conjunction with an oleophilic composite or metal layer will generally be hydrophilic. The imaging layer should be hard yet flexible, and highly wear-resistant. In addition, materials utilized in this layer should form a strong bond to surrounding layers, but the bond should be easily weakened during laser ablation. Suitable materials for the imaging layer include, but are not limited to, ceramics, metals, metal oxides, and polymers.

Ceramics include refractory oxides, carbides, and nitrides of metals and non-metals. Suitable ceramic materials include, but are not limited to, interstitial carbides (e.g., TiC, ZrC, HfC, VC, NbC, TaC, $Cr_3C$, $Mo_2C$, and WC), covalent carbides (e.g., $B_4C$ and SiC), interstitial nitrides (e.g., TiN, ZrN, HfN, VN, NbN, TaN, BN, and $Si_3N_4$), metal oxides (e.g., TiO, $Ti_2O_3$, BeO, MgO, and $ZrO_2$), carbonitrides, oxynitrides, oxycarbides, as well as combinations thereof. Other suitable ceramic materials are straightforwardly identified by those of skill in the art, e.g., by reference to Pierson, “Handbook of Refractory Carbides and Nitrides” (1996, William Andrew Publishing, NY). Ceramic imaging layers may also include dopants, such as copper, for example.

Ceramic imaging layers can be deposited using any vacuum deposition technique known in the art suitable for deposition of inorganic compounds. Magnetron sputtering deposition, once again, is a preferred technique because of the well-known advantages for coating of large-area substrates. Selection of optimum deposition conditions for films with selected atomic composition is well within the skill of practitioners in the art. Ceramic imaging layers are generally applied in thicknesses ranging from about 20 nm to about 45 nm.

The ceramic sputtering deposition process is desirably carried out in sequence in the same vacuum system after deposition of the other layers of the plate construction. The base pressure of the vacuum system is kept at values on the order of $10^{-5}$ Torr for all the deposition processes. This low pressure reduces the amount of water and other contaminants that could affect the properties of the ceramic imaging layer. For example, reduction or elimination of oxygen in the deposition system is desirable because oxygen can react with the metal species during magnetron deposition process, leading to the deposition of non-stoichiometric ceramic films with degraded optical, thermal, and mechanical properties. The magnetron sputtering deposition processes are typically carried out using flows argon or gas mixtures that bring the total pressures to values on the order of 1-3 mTorr.

Suitable metals for the imaging layer include, but are not limited to, titanium, aluminum, zinc, chromium, vanadium, zirconium, and alloys thereof. Metal imaging layers are preferably thin (e.g., about 50 Å to about 500 Å) to minimize heat transport within the imaging layer (i.e., transverse to the direction of the imaging pulse), thereby concentrating heat within the region of the imaging pulse so as to effect image transfer at minimal imaging power. While metals have the optical and thermal properties required for the imaging mechanism described herein, they may lack the mechanical and tribological characteristics required for structures that capable of enduring the wear conditions imposed by a printing press. Accordingly, if metals are to be used, they are desirably combined with a durable or hard ceramic material or layer.

Polymers suitable for use in imaging layers according to the invention may inherently IR-absorbing (e.g., polypyrroles) or may contain one or more IR-absorbing additives dispersed therein. Suitable polymers include, but are not limited to, vinyl-type polymers (e.g., polyvinyl alcohol) polyurethanes, cellulosic polymers (e.g., nitrocellulose), polycyanoacrylates, and epoxy polymers. The imaging layers may also be formed from a combination of one or more polymers, such as nitrocellulose in combination with a vinyl-type polymer.

Suitable IR-absorbing materials include a wide range of dyes and pigments, such as carbon black (e.g., CAB-O-JET 200, sold by Cabot Corporation, Bedford, Mass., and BONJET BLACK CW-1, sold by Orient Corporation, Springfield, N.J.), nigrosine-based dyes, phthalocyanines (e.g., aluminum phthalocyanine chloride, titanium oxide phthalocyanine, vanadium (IV) oxide phthalocyanine, and the soluble phthalocyanines supplied by Aldrich Chemical Co., Milwaukee, Wis.), naphthalocyanines, iron chelates, nickel chelates, oxoindolizines, iminium salts, and indophenols, for example. Any of these materials may be dispersed in a prepolymer before cross-linking into a final film. Alternatively, the absorber may be a chromophore chemically integral with the polymer backbone; see, e.g., U.S. Pat. No. 5,310,869. Polymeric imaging layers can include other additives known in the art, including, for example, cross-linking agents.

Polymeric imaging layers can be applied using any coating technique known in the art such as wire-wound rod coating, reverse roll coating, gravure coating, or slot die coating, for example.

f. Protective Layer 112, 212

Negative-working printing members desirably include a hydrophilic protective layer disposed over the imaging layer to protect the surface of the imaging layer against contamination due to exposure to air and damage during plate handling. In addition, the protective layer may help to control the imaging process by modifying the heat dissipation characteristics of the printing member at the air-imaging layer interface. The protective layer may be totally or partially removed in the first stages of the printing process with the aqueous solutions used in press systems. Portions of the protective layer that remain bonded to the imaging layer enhance the interaction of water component of the fountain solution with the non-image surfaces of the lithographic printing member.

Suitable materials for protective layers according to the invention include hydrophilic polymers, such as polyalkyl ethers, polyhydroxyl compounds, and polycarboxylic acids. For example, a hydrophilic protective layer may include a fully hydrolyzed polyvinyl alcohol (e.g., Celvol 305, 325 and 425 sold by Celanese Chemicals, Ltd. Dallas, Tex.), which are usually manufactured by hydrolysis of polyvinyl acetates. The use of fully hydrolyzed alcohol is preferred to assure that residual non-hydrolyzed acetate does not affect the hydrophilic behavior of the surface. The presence of residual polyvinyl acetate moieties in the protective layer promotes interaction of the non-image areas of the printing member with printing inks, which can diminish print quality.

Protective layers are typically applied between 0.05 and 1 $g/m^2$ using coating techniques known in the art, such as wire-wound rod coating, reverse roll coating, gravure coating, or slot die coating. For example, in particular embodiments, the protective layer is applied using a wire-round rod, followed by drying in a convection oven.

The protective layer can also include hydrophilic plasma polymer films deposited by vacuum coating techniques, as discussed above. Such protective layers may also be applied by plasma polymerization of gas mixtures that produce polymer films with polar functional groups. For example, a protective layer may applied using plasmas of reactive gas mixtures (e.g., oxygen, carbon dioxide, nitrogen, and/or nitrogen oxide mixed with hydrocarbon gases), or using hydrocarbons containing oxygen functional groups.

3. Imaging Techniques

Figure 3:
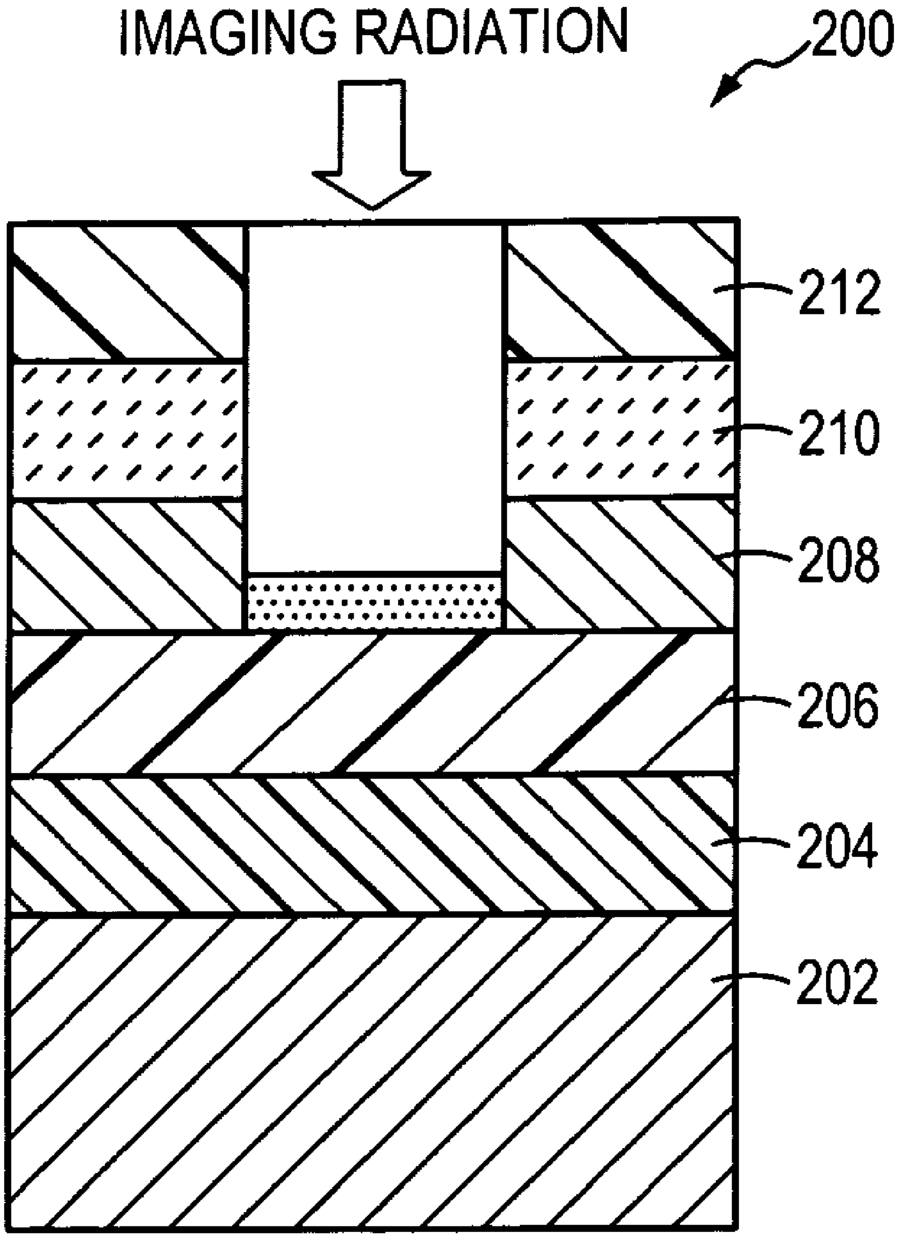
FIG. 3 illustrates the effect of imaging the printing member illustrated in FIG. 2.

FIG. 3 shows the consequences of imaging the printing member illustrated in FIG. 2. The printing member may include a substrate, a hard-coat transition layer, an oleophilic plasma polymer layer, an oleophilic metal (e.g., copper) layer, a hydrophilic (e.g., TiC) imaging layer, and a hydrophilic protective layer. As illustrated in FIG. 3, the exposed area of the imaging layer 210 of this plate absorbs the imaging pulse and converts it to heat. The heat diffuses through the imaging layer 210 and the metal layer 208 until it reaches the interface between the metal layer 208 and the plasma polymer layer 206. The plasma polymer layer 206, the transition layer 204 and the substrate 202 (if polymeric) generally do not conduct heat as well as the imaging and metal layers, so the heat from the imaging layer 210 and metal layer 206 builds up at the interface until the imaging and metal layers, and portions of the plasma polymer layer 206 near the interface, ablate. Ablation occurs, for example, when the interfacial polymer layers undergo either rapid phase transformation (e.g., vaporization) or rapid thermal expansion. This process is mainly attributed to the contribution of an explosive mechanism generated in the image areas of the plate by exposure to laser radiation. In this context, the plasma polymer layer 206 enhances production of vaporized materials at the interface during laser exposure, leading to the development of a positive pressure that assists film separation or ablation. Differences in thermal expansion coefficients of the plasma polymer layer and the copper layer may also disrupt the adhesion of the layers at the interface. The separation of the imaging and metal layers from the plasma polymer layer 206 (i.e., the "image-release" mechanism) reduces the amount of energy necessary to image printing members according to the invention, thus increasing the efficiency of printing processes utilizing such printing members.

After imaging, the protective layer 212, the imaging layer 210, the metal layer 208, and at least a portion of the plasma polymer layer 206 are degraded and/or de-anchored in the areas that received imaging radiation. The exposed areas that contain ablation debris are ink-receptive and serve as the precursor to the image areas of the printing member, while the non-imaged portions of the hydrophilic protective layer 212 accept water. Thus, the printing member can be used on press immediately after being imaged without the need for a post-imaging processing step.

After repeated exposure to printing fluids, the ablation debris may be carried away from the printing member; at this point, the small remaining thickness of the plasma polymer layer 206 provides the necessary ink-accepting surface. In addition, all or a portion of the protective layer 212 may be removed by the printing fluids, exposing the underlying hydrophilic imaging layer which acts as the water-accepting surface.

Figure 7:
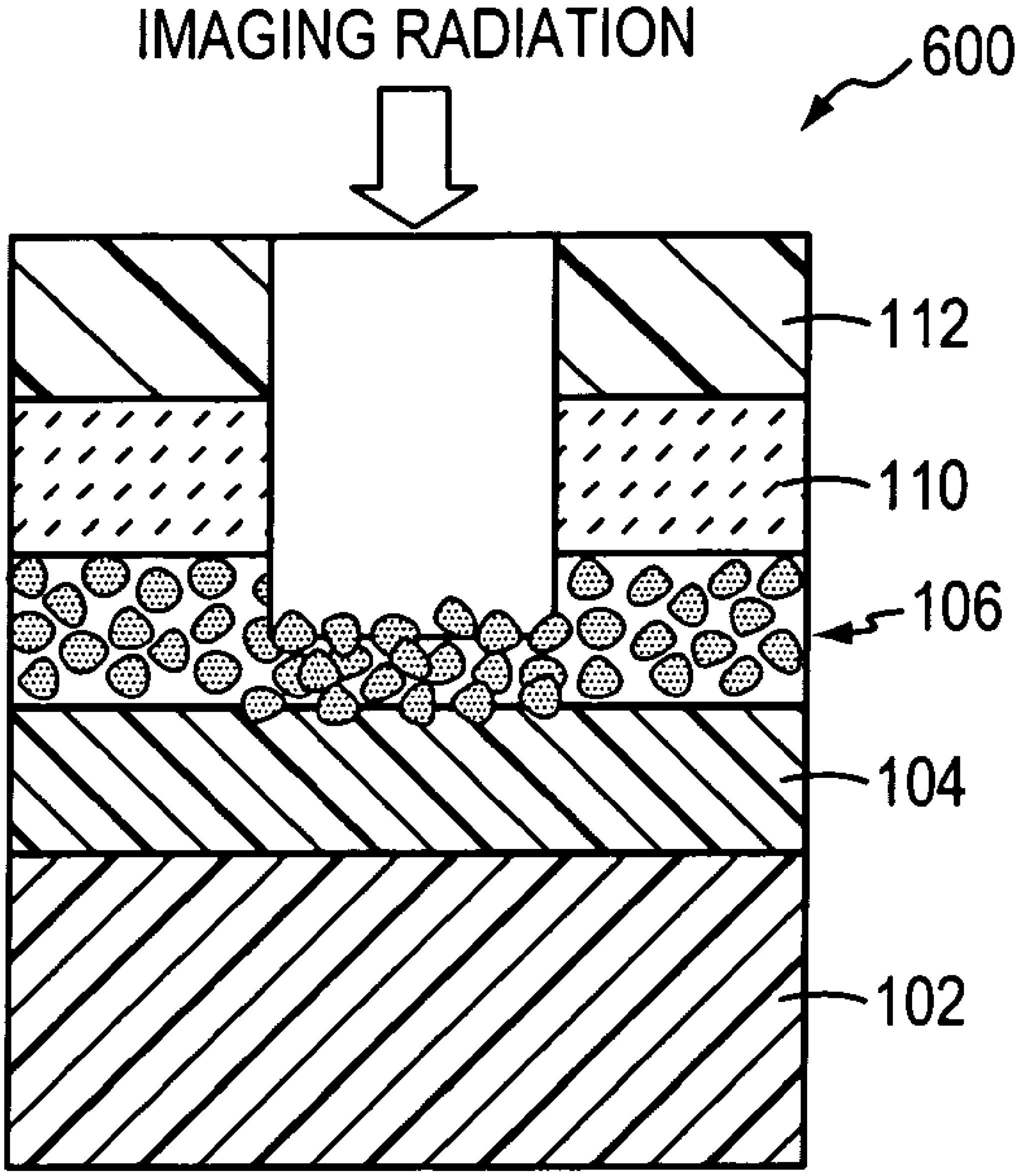
FIG. 7 illustrates the effect of imaging the printing member illustrated in FIG. 6.

A similar mechanism is illustrated in FIG. 7 for a plate having a composite metal-polymer layer, as shown in FIG. 6. In this case, the residual thickness of the composite layer contains a high proportion of metal (e.g., copper) particles (which may be fused as described below), and therefore exhibits good oleophilicity. In the positive-working plate 100 shown in FIG. 1, by contrast, the entirety of layer 106 is removed by an imaging pulse.

In the embodiments illustrated in FIGS. 1 and 2, heat transfer and diffusivity are considerably enhanced by the metal film or metal particles. The thermal conductance of copper, for example, is about 10 times higher than that of TiC. A system with such a high thermal conductance exhibits its significant heat diffusion in the radial direction.

Another useful property of copper is its melting point, which is much lower than that of typical ceramics. The heat generated during the imaging process causes vaporization of the polymeric component and partial melting (but not vaporization) of the copper film, producing printing areas covered with a thin film of residual copper. Analysis of surface topography using SEM revealed that the image areas of the plates remain covered with a large population of metal particles. This also evidence of some some partial thermal modification of the substrate due to the heat generated in the process. However, the modified areas remain covered with some residual metal. The highly oleophilic character of the image area of the printing member is largely determined by the character of the metal species left behind on the exposed areas.

4. EXAMPLES

Several embodiments of the present invention are described in the following examples, which are intended to illustrate, not to limit, the scope and nature of the present invention. Plasma processes were conducted on a substrate suitable for the construction of the different embodiments of the present invention. The following examples refer to plate structures built on a white polyester base (MELINEX from Dupont-Teijin) coated with a transparent hydrophilic polymer coating (provided by Bekaert Specialty Films). The substrate was evacuated in a magnetron sputtering system down to a base pressure of about $1.4\times10^5$ Torr before any deposition took place.

In all cases, the plasma polymerization processes was carried out with methane plasmas produced by a DC magnetron sputtering source to yield plasma polymer layers with thicknesses in the range of about 5 nm. The metal sputtering process was performed in an argon atmosphere using the same DC magnetron sputtering source. The primary metal used in the examples was copper.

A variety of experimental techniques were used to study the properties of the plasma polymer layers, metal, and metal-plasma polymer composite films, as well as the surfaces exposed after imaging. Surface information for the plain films and surfaces exposed after imaging was obtained using surface-sensitive techniques such as XPS and contact-angle measurements. The surface topographies of these surfaces were investigated with SEM and optical profilometry. The optical reflectance and absorbance of single layers and printing member structures were determined with UV-Visible-Near-IR reflectance spectroscopy. The electrical conductance was measured by a non-contact method.

Changes in the composition of the gases present in the vacuum chamber during the plasma polymerization process were monitored using mass spectrometry. For example, the production of hydrogen and larger molecules (e.g., carbon species with two to four carbon atoms) during methane plasma production was confirmed using mass spectrometry, indicating that the activated methane molecules grow and recombine to form polymeric species in the plasma and the rest of the vacuum system.

Example 1

The structure shown in FIG. 1 can form part of the plate shown in FIG. 6. The layer 106 may be a composite material containing copper clusters coated with plasma polymer. In this example, the two components were co-deposited by magnetron sputtering of a copper target in the presence of a mixture of sputtering gas and a polymer-forming hydrocarbon gas. This composite layer has physical and chemical properties intermediate in between those of the metal and plasma polymer components. Magnetron sputtering deposition of plasma polymer, copper, and copper-doped polymer-like carbon films were conducted on different polymer substrates suitable for the different lithographic plate embodiments described herein. The metal deposition was carried out in a pure argon atmosphere using argon flow of 50 sccm. The composite copper-polymer film was produced in the same system using a mixture of argon and methane. For this example, an argon/methane mass flow ratio of 1.0 was selected. The processes were carried out in DC magnetron sputtering source plasma to yield films having a thickness of about 10 nm.

The following results refer to the properties of plasma polymer, copper and copper-doped polymer-like carbon films applied on a white polyester base (MELINEX from Dupont-Teijin) and coated with a transparent hydrophilic polymer coating (provided by Bekaert Specialty Films). The films were also applied on a clear version of the same substrate that uses a clear polyester base, and on glass slides. Table 1 summarizes the properties of the metal and metal-doped polymer-like carbon films deposited in DC sputtering systems using similar power levels and deposition times.

TABLE 1

| Film | Color | Thickness (nm) | Conductance (Mho/Sq) | % Reflect-ance 915 nm | Water advancing contact angle (degree) |
|---|---|---|---|---|---|
| Polymer-like carbon film | Clear | 10 | $<1 \times 10^{-4}$ | 6 | 85 |
| Copper | Red | 13 | 0.08 | 82 | 20 |
| Copper-doped Polymer like film | Green | 10 | $<1 \times 10^{-4}$ | 29 | 62 |

The as-deposited copper film is an electrical conductor that exhibits the metallic luster and high specular reflectivity characteristic of clean, polished copper surfaces. The plain plasma polymer, by contrast, is a non-conductive clear film. Finally, the copper-doped plasma polymer composite deposited on these substrates takes the form of partially transparent greenish films that exhibit very poor electrical conductance ($<10^{-4}$ mohs/sq).

Reflectance and transmittance spectra were obtained in a range of wavelengths between 200 nm and 1500 nm for copper and copper-composite films of comparable thickness deposited on a clear substrate. In general, the effect of the incorporation of the metal in the polymer matrix is to reduce the reflectivity and increase the transparency of the film through a wide range of wavelengths. The copper-doped polymer-like films are more efficient absorbers of radiation in the near IR region (% Absorbed=100−(% Reflected+% Transmitted)).

XPS work was carried out in order to determine the chemical composition of the film surfaces. The freshly deposited samples were exposed to air for short periods before loading into the high vacuum chamber of the instrument. The samples were analyzed in a system equipped with a monochromatic X-ray aluminum Ka source and Ar-sputtering capabilities for surface cleaning and depth profile studies. It is well known in the art that the XPS technique allows a clear identification of different copper oxide species or oxidation states.

The XPS work carried out on the substrates covered with the metal films and copper-doped plasma-polymer films of varying thickness showed that both types of film form a passive oxide layer immediately upon exposure to air. However, the copper film is mainly covered with thin film of cupric oxide (CuO) while the composite film is covered with a very thin layer of cuprous oxide ($Cu_2O$) and copper hydroxide. The results also showed that the combined process carried out in the argon-methane mixture produces a composite film of metal particles coated and embedded in a polymer-like matrix. Both the $Cu_2O$ and the polymer-like films most likely passivate the copper particles and provide protection against further oxidation.

The formation of a carbon-rich surface on the composite film likely explains the higher hydrophobic character of the polymer-coated copper particles, as indicated by advancing contact-angle measurements carried out on these surfaces. Therefore, the as-deposited composite structure has advantageous surface properties for utilization as the oleophilic component of a wet lithographic printing plate. Additional SEM work also revealed differences in the topography of the films. In general, the copper-doped films present smaller particle sizes and appear to grow in a denser film structure.

Example 2

Negative-working plates were produced on the basis of the general structure depicted in FIG. 2. A MELINEX polymer base was coated with a hard polymer coating (such as those provided by Bekaert Specialty Film and Tekra). This structure was placed in an evacuated magnetron sputtering system to a base pressure of $10^{-5}$ Torr, and coated with a polymer-like layer having a thickness on the order of 5 nm. The deposition process utilized a carbon target in an argon-methane atmosphere. The polymeric film was subsequently coated, in the same vacuum system, with a copper film of 20 nm, and then a TiC film of thickness 35 nm produced by magnetron sputtering deposition in an argon atmosphere using separate copper and titanium carbide targets.

This structure was exposed to air, allowing the ceramic film to develop the native oxide passivation layer. Finally, a protective layer was added to the ceramic layer by applying a 1% solution of a fully hydrolyzed polyvinyl alcohol (CELVOL 325 from Celanese Chemicals, Dallas, Tex.), followed by oven drying. Simplified plate constructions were produced using similar procedures to identify the functionality of the different layers of the plate construction: (a) plate construction with only TiC layer (b) plate with copper and TiC layers, and (c) plate construction with plasma polymer and TiC layers.

The minimum energy requirement for producing an acceptable image on each plate was determined using different platesetters, including the PEARL and DIMENSION 400 (Presstek, Inc., Hudson, N.H.) and the TRENDSETTER (Creo, Inc., Vancouver, Canada). These imaging devices used near-IR laser diode outputs and dwell times in the microsecond range. The DIMENSION 400 utilizes a set of multimode laser diodes that deliver a non-uniform laser energy profile to the plate surface. The TRENDSETTER utilizes a single laser source (diode array) whose output is split into a large set of channels, and delivers a uniform square energy profile to the plate surface. This plate construction displays good imaging performance. Acceptable or good imaging performance herein refers to the production of well-differentiated image areas using power densities within the levels recommended by the commercial imaging devices, and without causing side effects on the exposed printing areas, such as thermal degradation. The results of a comparison of different constructions are given in the following Table 2:

TABLE 2

| Plate construction | Plasma polymer thickness (nm) | Copper layer thickness (nm) | TiC Thickness (nm) | Creo Imaging density (mJ/cm$^2$) | Dim 400 Average Imaging density (mJ/cm$^2$) |
|---|---|---|---|---|---|
| (a) | 0 | 0 | 35 ± 2 | >420 | >530 |
| (b) | 0 | 30 ± 2 | 35 ± 2 | >420 | >530 |
| (c) | 5 ± 1 | 0 | 35 ± 2 | 360-380 | 470-500 |
| New | 5 ± 1 | 30 ± 2 | 35 ± 2 | 280-310 | 420-450 |

The imaging sensitivity of this printing member exceeds that of the control plate and other simplified plate constructions. For example, the energy required to image plate constructions without the polymer-like layer, structures (a) and (b), on the Creo platesetter exceeded 420 mJ/cm$^2$. This high energy level, however, also caused some thermal degradation of the underlying substrate, resulting in a reduction in the ink-receptivity of the exposed image areas. In contrast, the plate containing a plasma polymer layer requires imaging energy in the order of 360-380 mJ/cm$^2$. Furthermore, with the plate constructions described herein, the incorporation a copper metal layer over the plasma polymer layer brought the imaging requirements of the plate structure to energy levels below 320 mJ/cm$^2$. Power requirements were also reduced on the DIMENSION 400 system.

The image areas of the structures (a), (b), and (c) have a white coloration typical of the substrate. However, the image area of the complete printing member has a greenish coloration, which indicates the presence of residual copper species (see FIG. 3). Surface studies with XPS and SEM showed that the exposed image areas are covered with a powdery film containing large amounts of residual copper. Additional surface studies indicated that part of the copper material is practically melted and embedded into the exposed polymer substrate. In summary, the image area is covered with a relatively thick and weakly bonded copper film and a very thin and strongly bonded copper film. Therefore, removal of the imaging layer leaves a copper-rich printing image.

Independent of the imaging system used, the exposed image areas of the copper-based plate construction display good ink-receptivity, which is very stable in long-run length press works. A key improvement of the present invention is the production of ready-to-use image areas even when the plate structures are imaged on systems that deliver non-uniform high power to the plate surface, such as the DIMENSION 400 system, causing extensive thermal damage to the polymer components of the structure.

Durability, however, may be limited due to the incorporation of the copper layer in the plate construction. Plate durability may, for example, be degraded because of solubility of the copper film due to oxidation in the acidic environments typically used in lithographic applications. This problem affects the non-image or unexposed areas of the plates but does not affect the ink-receptivity of the image areas. The non-image areas of this printing member experience wear due to slow dissolution of the inner copper film. Therefore, the columnar TiC film does not provide enough protection to prevent slow copper etching in the acidic press environments. Plate wear limits the plate life to approximately 8 to 10 hours of press operation. Wear problems are more evident at second-day startups after plate storage for more than 24 hours.

This plate construction may be well-suited to short run lengths (25,000 or one-day operation) when used with fountain solutions with pH range 4.5-5.0. However, it may tolerate extended run lengths in more neutral press environments (pH>5).

Example 3

In separate procedures, copper films of varying thickness were coated on plates produced in accordance with Example 2. The substrate was coated with a polymer-like layer having a thickness on the order of 5 nm. Separate plate constructions were produced with copper films having thicknesses between about 10 nm and about 40 nm, and a TiC ceramic layer having a thickness of 35 nm. Plates without a copper layer were also tested for comparison. The plates were imaged on the DIMENSION 400 in order to evaluate the laser-media compatibility given the non-uniform laser energy profile. Freshly imaged plates were used on-press to check the ink-receptivity of the exposed surfaces.

The durability of each plate was evaluated using a standard pencil hardness test, in which standard pencils of various hardnesses (with 9H being the hardest) are drawn across the plate surface. The hardest pencil that does not leave a mark on the surface is considered the "pencil hardness" of the plate. In addition, the tribology characteristics of each plate were evaluated by exposing the plates to a reciprocating abrasive process using a soft abrader material and isopropyl alcohol for lubrication. In order to test the resistance to exposure to acidic environments, the plates were immersed fountain solutions of variable pH for a period of 24 hours. The latter is a pass/fail test where plate failure may be evidenced either visually or by easy removal of the metal-ceramic film by mild abrasion. The results of these experiments are summarized in the following Table 3.

TABLE 3

| Copper layer thickness (nm) | Pencil hardness | Wear test (No. of cycles) | Acidic Environment test pH 4.2 | pH 5.5 |
|---|---|---|---|---|
| 0 | 6H | 320 ± 20 | Pass | Pass |
| 10 ± 1 | 6H | 320 ± 20 | Fail | Pass |
| 30 ± 1 | 6H | 320 ± 20 | Fail | Pas |
| 40 ± 1 | 6H | 300 ± 20 | Fail | Pass |

All copper-based plate constructions display mechanical and wear behavior comparable to that of the control plate when used in neutral environments. However, in contrast to the control plate, the durability of the former is considerably degraded due to solubility of the copper films in the acidic fountain solution environments at pH<5. The plates start showing minor indications of failure when exposed to the solution at pH 5.5 for more than 48 hours. On the other hand, plates immersed in tap water (pH 6.8) do not show any sign of degradation following exposure to water for more than a week. Therefore, the degradation process occurs only in the presence of the oxidizing acid, and the rate of the oxidative process increases as a function of pH.

All plates were imaged on the DIMENSION 400 at a series of power settings to determine the minimum requirements for acceptable imaging. In addition, the fresh plates were tested on-press immediately after imaging in order to verify the ink-receptivity of the exposed image areas. The image areas of all plates exhibited the greenish coloration characteristic of the copper-rich surface. All these printing members, independent of the copper layer thickness, exhibit imaging sensitivity comparable to that described for Example 1. Therefore, the utilization of relatively thick copper layers did not provide further improvement to imaging sensitivity.

Finally, all plates were used on a press a few minutes after imaging. All copper-based plate constructions generate image areas with good ink-receptivity, which was very stable for long run lengths. In addition, the ink densities do not degrade after cleaning of the plates with typical commercial plate cleaners or at print startup. The control plate was not ready for use shortly after imaging, requiring either an aging time (about 8 hours of air exposure) or a precleaning step to generate image areas with high ink-receptivity on the press conditions used for this test.

Example 4

Negative-working plates were produced according to the general structure depicted in FIG. 4. A MELINEX polymer base was coated with a hard polymer coating and placed in an evacuated DC-magnetron sputtering system. The construction was coated with a copper layer to a thickness of about 20 nm. The copper film was subsequently coated, in the same vacuum system, with a plasma polymer layer having a thickness on the order of 5 nm, and a TiC film of thickness 35 nm. The structure was coated with a hydrophilic PVOH topcoat that provides a permanent hydrophilic surface on the negative-working structure as described in Example 2. This plate construction was studied according to the procedures described above.

The objective of this and the following examples was to produce printing members having good resistance to acidic environments. The plate durability was evaluated according to procedures described in Examples 2 and 3. This printing member displayed the required improvements in ink-receptivity for process-free applications when imaged on commercial high-power and non-uniform laser sources. It also showed enhanced imaging sensitivity. Imaging energy requirements are comparable to those obtained for Example 2. The behavior in acidic environment was also comparable to that of Examples 2 and 3. This plate construction may be well-suited to short run lengths (25,000 or one-day operation) when used with fountain solutions with pH range 4.5-5.0. However, it may tolerate extended run lengths in more neutral press environments (pH>5).

Example 5

Negative-working plates were produced according to the general structure depicted in FIG. 5. A MELINEX polymer base was coated with a hard polymer coating and placed in an evacuated DC-magnetron sputtering system. The construction was coated with plasma polymer and copper layers having thicknesses of about 5 nm and 20 nm, respectively. The copper film was subsequently coated, in the same vacuum system, with a second plasma polymer layer having a thickness on the order of 5 nm, and a TiC film of thickness 35 nm. In this plate construction the copper film is enclosed in between two layer of the dense plasma polymer. The structure was also finished with a hydrophilic PVOH topcoat that provides a permanent hydrophilic surface on the negative-working structure as described in Example 2. This plate construction was then studied according to the procedures described above.

The printing member exhibited good ink-receptivity for process-free applications, as well as enhanced imaging sensitivity. Imaging energy requirements are comparable to those obtained in Example 1. The plate durability was evaluated according to procedures described in Examples 2 and 3. This printing member displays limited improvement in resistance to oxidation in acidic environments. In general, it also shows signs of chemically induced degradation, but the rate and the mechanism of failure is not as drastic as that observed for the printing member described in Examples 1, 2 and 4. This example shows that continuous polymer-like layers provide additional barrier effects for the protection of the copper film, and reduce the rate of copper loss due to oxidation. However, this does not guarantee extended durability on different press environments because of the possibility of chemical wear problems as a function of press time.

Example 6

Negative-working plates were produced according to the general structure depicted in FIG. 6. A MELINEX polymer base was coated with a hard polymer coating and placed in an evacuated DC-magnetron sputtering system. This was coated with a copper-doped polymer-like layer having a thickness on the order of 10 nm following the procedure described in Example 1. The copper-doped polymer film was subsequently coated, in the same vacuum system, with a TiC film of thickness 35 nm. This structure was coated with the hydrophilic PVOH topcoat that provides a permanent hydrophilic surface on the negative-working structure as described in Example 2. This plate construction was studied according to the procedures described in previous examples.

The printing member exhibits imaging performance comparable to that of plates based on separate copper and plasma-polymer films (Examples 2-5). Energy requirements were reduced for both the TRENDSETTER and DIMENSION 400 imaging systems. For example, the energy levels on the TRENDSETTER were reduced to levels in the order of 320 $mJ/cm^2$. The exposed image areas show the characteristic greenish coloration that resembles that of the copper-doped polymer film. XPS and SEM work indicated that the exposed areas have a large copper content (FIG. 7), and that a large portion of the polymer component is lost due to evaporation during the thermal imaging process.

The test plates were imaged on the DIMENSION 400, which delivers a non-uniform laser energy profile. The freshly imaged plates showed a quick start-up time with ink-receptivity comparable to the plate structures based on separate copper and plasma polymer layers as described in previous examples. Therefore, the copper-polymer composite structure not only produces a printing member with acceptable imaging performance, but also generates image areas with residual copper particles that exhibit a strong affinity for ink. The ink-receptivity remained stable in long run-length press works.

Plate durability on-press was considerably enhanced with the incorporation of the copper-doped plasma polymer layer in the plate construction, which exhibits good resistance to acidic environments. This property was evaluated according the procedures described in Examples 2 and 3. The plate wear resistance was not affected upon exposure to low-pH environments for periods much longer than 48 hours. Therefore, the copper component of the structure is well-protected against oxidation in the composite polymer matrix. It was verified that this printing member could be used on press for run lengths higher than 50,000 impressions and up to 100,000 impressions, depending on the press conditions.

Example 7

In separate procedures, copper-doped polymer-like carbon layers of varying thickness were coated on plates produced in accordance with Example 6. Plates without the copper-doped film were also tested for comparison. The copper-doped plasma-polymer film thickness was varied from about 3 nm to about 20 nm. The plates were imaged on different commercial imaging devices in order to determine the effect of this parameter on the printing and imaging characteristics of the plates.

It was verified that with this plate embodiment, it is advantageous to optimize the thickness of the copper-doped plasma-polymer layer. Printing members containing copper-doped polymer-like films below 5 nm in thickness do not immediately exhibit sufficient ink-receptivity. However, over time, these constructions show some improvement in imaging performance. In general, imaging sensitivity and ink-receptivity require a minimum thickness of the copper-doped polymer-like carbon layer. The film thickness should be at least about 5 nm to impart adequate ink-receptivity to the plate structure. Table 4 shows a comparison of the imaging sensitivity of different plate structures.

TABLE 4

| Plate construction | Co-doped Plasma polymer thickness (nm) | TiC Thickness (nm) | Creo Imaging density ($mJ/cm^2$) | Dim 400 Imaging density ($mJ/cm^2$) |
|---|---|---|---|---|
| (a) | 0 | 35 ± 2 | >420 | >530 |
| (b) | 4 | 35 ± 2 | 360-380 | 480-510 |
| (c) | 8 ± 1 | 35 ± 2 | 310-330 | 430-460 |
| (d) | 10 ± 1 | 35 ± 2 | 310-300 | 430-460 |
| (e) | 20 ± 2 | 35 ± 2 | 290-310 | 420-450 |

All plate constructions based on the co-doped polymer film exhibit good resistance to chemical degradation in acidic environments.

Example 8

In separate procedures, copper-doped polymer-like carbon layers with varying copper concentrations were deposited as described on Example 1. The film thickness was kept constant at about 10 nm, and the copper-to-carbon atomic ratio of the films was varied between about 0.1 and 5.0. The copper content of the co-doped films was controlled using a parameter such as argon and methane mass-flow ratio and/or the plasma source power. Film compositions were determined using XPS measurements.

The plates were imaged on the DIMENSION 400 commercial system in order to determine the effect of the copper content of this ink-receptive layer on the printing and imaging performance of the plates. In general, it was found that a minimum amount of copper is generally required in the films to obtain good ink-receptivity and imaging sensitivity. Films with carbon-to-copper ratios below 1.1 did not provide these properties. On the other hand, the maximum copper content of the film is limited because the printing member shows signs of sensitivity to acidic environments at copper-to-carbon atomic ratios higher than 3.8. Therefore, the copper-to-carbon atomic ratio of the films should be kept between about 1.1 and 3.8 to ensure the construction of process-free printing members with high imaging sensitivity and press durability.

Although the present invention has been described with reference to specific details, it is not intended that such details should be regarded as limitations upon the scope of the invention, except as and to the extent that they are included in the accompanying claims.

What is claimed is:

1. A method of imaging a lithographic printing member, the method comprising the steps of:

(a) providing a printing member having an imaging layer, a plasma polymer layer, a metal in the form of a discrete layer adjacent to the plasma polymer layer or dispersed in particulate form within the plasma polymer layer, and a substrate therebeneath, wherein (i) the imaging layer, but not the metal, is subject to ablative absorption of imaging radiation, (ii) the plasma polymer layer comprises a plasma-polymerized hydrocarbon, and (iii) the imaging layer and at least the metal have opposite affinities for at least one of ink and a liquid to which ink will not adhere;

(b) exposing the printing member to imaging radiation in an imagewise pattern so as ablate substantially all of the imaging layer, but not the metal, exposed to the imaging radiation; and (c) removing at least the imaging layer where the lithographic printing member received radiation to reveal the metal, thereby creating an imagewise lithographic pattern on the printing member.

2. The method of claim 1, wherein the imaging layer is hydrophilic.

3. The method of claim 1, wherein the imaging layer comprises a ceramic.

4. The method of claim 1, wherein the metal is oleophilic.

5. The method of claim 4, wherein the metal is a noble metal.

6. The method of claim 5, wherein the metal is selected from the group consisting of copper, gold, silver, platinum, palladium, and alloys or combinations thereof.

7. The method of claim 4, wherein the metal is copper.

8. The method of claim 1, wherein the metal is present as a discrete layer.

9. The method of claim 8, wherein the metal is disposed above the plasma polymer layer.

10. The method of claim 8, wherein the metal is disposed below the plasma polymer layer.

11. The method of claim 8, wherein (a) the printing member comprises a plurality of plasma polymer layers, and (b) the metal is disposed between two plasma polymer layers.

12. The method of claim 1, wherein the metal is dispersed in particulate form within the plasma polymer layer.

13. A lithographic printing member comprising:

(a) an imaging layer subject to ablative absorption of imaging radiation;

(b) a plasma polymer layer comprising a plasma-polymerized hydrocarbon;

(c) a metal not being subject to ablative absorption of imaging radiation; and (d) a substrate beneath the imaging and plasma polymer layers, wherein the imaging layer and at least the metal have opposite affinities for at least one of ink and a liquid to which ink will not adhere, and further wherein (i) the metal is disposed above the plasma polymer layer, or (ii) the printing member comprises a plurality of plasma polymer layers, and the metal is disposed between two plasma polymer layers, or (iii) the metal is dispersed in particulate form within the plasma polymer layer.

14. The lithographic printing member of claim 13, wherein the imaging layer is hydrophilic.

15. The lithographic printing member of claim 13, wherein the imaging layer comprises a ceramic.

16. The lithographic printing member of claim 13, wherein the metal is oleophilic.

17. The lithographic printing member of claim 16, wherein the metal is a noble metal.

18. The lithographic printing member of claim 17, wherein the metal is selected from the group consisting of copper, gold, silver, platinum, palladium, and alloys or combinations thereof.

19. The lithographic printing member of claim 18, wherein the metal is copper.

20. The lithographic printing member of claim 13, wherein the metal is present as a discrete layer.

21. The lithographic printing member of claim 20, wherein the metal is disposed above the plasma polymer layer.

22. The lithographic printing member of claim 20, wherein (a) the printing member comprises a plurality of plasma polymer layers, and (b) the metal is disposed between two plasma polymer layers.

23. The lithographic printing member of claim 13, wherein the metal is dispersed in particulate form within the plasma polymer layer.

* * * * *